(12) United States Patent
Hollis et al.

(10) Patent No.: US 7,466,607 B2
(45) Date of Patent: Dec. 16, 2008

(54) MEMORY ACCESS SYSTEM AND METHOD USING DE-COUPLED READ AND WRITE CIRCUITS

(75) Inventors: Paul W. Hollis, Austin, TX (US); George M. Lattimore, Austin, TX (US); Matthew B. Rutledge, Austin, TX (US)

(73) Assignee: Analog Devices, Inc., Norwood, MA (US)

( * ) Notice: Subject to any disclaimer, the term of this patent is extended or adjusted under 35 U.S.C. 154(b) by 126 days.

(21) Appl. No.: 10/955,609

(22) Filed: Sep. 30, 2004

(65) Prior Publication Data

US 2006/0069894 A1    Mar. 30, 2006

(51) Int. Cl.
*G06F 13/372* (2006.01)
*G06F 13/368* (2006.01)

(52) U.S. Cl. ............... 365/189.19; 365/233.11; 365/189.04; 365/220; 710/125; 711/1; 711/169; 711/168; 711/167

(58) Field of Classification Search .............. 711/167
See application file for complete search history.

(56) References Cited

U.S. PATENT DOCUMENTS

| 5,717,653 | A  |   | 2/1998  | Suzuki                    |
|-----------|----|---|---------|---------------------------|
| 5,845,314 | A  | * | 12/1998 | Ishida ............. 711/104 |
| 6,075,730 | A  |   | 6/2000  | Barth et al.              |
| 6,959,016 | B1 | * | 10/2005 | Keeth et al. ........ 370/517 |
| 7,006,404 | B1 | * | 2/2006  | Manapat et al. ...... 365/233 |
| 2003/0172241 | A1 | * | 9/2003 | Shirota ............ 711/167 |

* cited by examiner

*Primary Examiner*—B. James Peikari
(74) *Attorney, Agent, or Firm*—Iandiorio Teska & Coleman

(57) ABSTRACT

A de-coupled memory access system including a memory access control circuit is configured to generate first and second independent, de-coupled time references. The memory access control circuit includes a read initiate circuit responsive to the first time reference and a read signal for generating a read enable signal, and a write initiate circuit responsive to the second time reference and a write signal for generating a write enable signal independent of the read enable signal for providing independent, de-coupled write access to a memory array.

27 Claims, 12 Drawing Sheets

MEMORY ACCESS SYSTEM AND METHOD USING DE-COUPLED READ AND WRITE CIRCUITS

FIELD OF INVENTION

This invention relates generally to memory access systems and more particularly to a de-coupled memory access system and method.

BACKGROUND OF INVENTION

Memory access systems, such as an embedded memory system in a processor core, e.g., an ARM, allow a processor to read data from memory and write data to memory. The read access time of the core processor includes the time to read the data from memory, a short setup time to latch the read data to a destination register, and the propagation delay time associated with transferring the read data out of memory to a destination register. The write access time includes time for the core processor to write data to the memory and the propagation time to transfer the write data from the processor to the memory. Typically, more time is required to read data from a given memory than to write data to memory resulting in the read access setting the maximum frequency of operation for the system.

Conventional memory access systems are typically limited to one operation per cycle, e.g., a read or a write, and require that the operations complete within a single cycle of the system clock. These systems rely on starting the read and write operations at the same relative start time (coupled), e.g., the rising edge of the system clock. In such a design the read access time defines the minimum clock cycle period. The result is the read access time is limited to the single system clock cycle which constrains the size and the access time of the memory being used or the speed of the system clock. This often requires the memory to be partitioned into smaller, faster memory blocks (e.g., less dense memory).

Prior memory access systems and methods attempt to solve the problems associated with longer read access time in several ways. One is to simply allow two clock cycles for the read access to complete. This allows the system clock to run faster but can seriously impair processor throughput.

Other conventional memory access systems borrow time from the write cycle for the read operation. Often the most critical situation is a back-to-back read then write operation. In this design, the delay write operation is delayed until the read operation is complete which is often referred to as a "delayed write" design. Since the system is utilizing a single system clock and the back-to-back operation must complete within two cycles, the write delays must be derived from the single system clock. Another drawback of conventional systems is that since the read access actually extends into the next cycle, special handling of the read data is required downstream from the memory. The result is either latching data on the opposite edge of the clock from that starting the access (potentially impacting throughput), or pipelining the delivery of data, which adds latency and complexity to the memory and processor design.

Generally in common to conventional memory access systems are a single system clock, a control signal which contains information whether the data is to be read or written, and valid address values which specify the exact addresses to be read or written during the respective read or write operations. The memory read and write operations usually initiate with, or with timing derived from, the same system clock edge associated with delivery of the control and address information. This precludes starting the read operation before the system clock since all of the necessary information is not available at that time. However, some processors (e.g., ARM) have that information available prior to the arrival of the initiating system clock edge.

SUMMARY OF THE INVENTION

It is therefore an object of this invention to provide an improved, de-coupled memory access system and method.

It is a further object of this invention to provide such a memory access system and method which can utilize more dense memory.

It is a further object of this invention to provide such a memory access system and method which can utilize slower memory.

It is a further object of this invention to provide such a memory access system and method which eliminates the need to partition the memory into smaller blocks.

It is a further object of this invention to provide such a memory access system and method which virtually negligibly increases circuit area.

It is a further object of this invention to provide such a memory access system and method which can optimize performance by providing independent, de-coupled time references for the read and write operations to fine tune the start time of the read operation and the write operation thereby increasing the time allowed for a read access.

It is a further object of this invention to provide such a memory access system and method in which the read operation can begin before the write operation based on independent time references.

It is a further object of this invention to provide such a memory access system and method which eliminates the need to start the read and write operations at the same time.

It is a further object of this invention to provide such a memory access system and method which increases the time allowed for a read access.

It is a further object of this invention to provide such a memory access system and method which delays the write operation relative to the read operation by using de-coupled time references.

The invention results from the realization that a truly innovative de-coupled memory access system and method can be achieved by providing independent, de-coupled first and second time references, generating a read enable signal to access memory in response to the first time reference and a read initialization signal, and generating a write enable signal in response to the second time reference independent of the read enable signal to provide independent, de-coupled read and write access to a memory array.

This invention features a de-coupled memory access system including a memory access control circuit configured to generate first and second independent, de-coupled time references. The memory access control circuit includes a read initiate circuit responsive to said first time reference and a read signal for generating a read enable signal, and a write initiate circuit responsive to the second time reference and a write signal for generating a write enable signal independent of the read enable signal for providing independent, de-coupled write access to a memory array.

In one embodiment, the memory access control circuit may be responsive to control signals and valid address values. The control signals may include the read signal and the write signal. The valid address values may specify the locations of data to be read from the memory array and the locations for data to be written to the memory array. The memory access control circuit may include a detection circuit responsive to the control signal, the valid address values and the first time reference. The detector circuit may be configured to detect the read signal and the write signal from the control signals. The detection circuit may include an address latching circuit configured to detect and capture the valid address values. The detection circuit may include a control latching circuit configured to detect and capture at least one of the control signals. The system may include a core circuit responsive to the read enable signal, the write enable signal, and the valid address values. The core circuit may be configured to independently write supplied data to the memory array in response to the write enable signal and independently read stored data from the memory array in response to the read enable signal. The core circuit may include a read/write circuit for independently writing the supplied data to the memory array and independently reading the stored data from the memory array. The read/write circuit may include a latch buffer configured to store the read data. The read/write circuit may forward the data stored in the latch buffer to a destination register. The first time reference may be generated from an early clock signal. The second time reference may be generated from a system clock signal. The transition of the early clock signal may enable the read initiate circuit to generate the read enable signal. The first rising edge of the early clock signal may enable the read initiate circuit to generate the read enable signal. The transition of the system clock signal may enable the write initiate circuit to generate the write enable signal. The first rising edge of the system clock may enable the write initiate circuit to generate the write enable signal. The first time reference and the second time references may be generated from a system clock signal. The first transition of the system clock signal may enable the read initiate circuit to generate the read enable signal. The first falling edge of the system clock may enable the read initiate circuit to generate the read enable signal. The second transition of the system clock signal may enable the read initiate circuit to generate the read enable signal. The first rising edge of the system clock may enable the read initiate circuit to generate the read enable signal. The first time reference may be generated from an early clock signal and the second time reference may be generated by a write delay circuit responsive to the early clock signal. The write delay circuit may be configured to delay the early clock signal by a predetermined amount of time to delay the write initiate circuit from generating the write enable circuit by the predetermined amount of time. The first time reference may be generated by a read delay circuit responsive to the system clock signal. The read delay circuit may be configured to delay the system clock signal by a predetermined amount of time to delay the read initiate circuit from generating the read enable circuit by a predetermined amount of time. The second time reference may be generated by a write delay circuit connected to a system clock. The write delay circuit may be configured to delay the system clock signal by a predetermined time to delay the write enable circuit from generating the write enable signal. The write initiate circuit may include a gating circuit configured to pass the write enable signal generated by the write initiate circuit to the core circuit when the write signal and the second time reference are received. The read initiate circuit may include a gating circuit configured to pass the read enable signal generated by the read initiate circuit to the core circuit when the read signal and the first time reference are received.

This invention also features a memory access control circuit responsive to a clock signal with a predetermined clock cycle for defining an expanded memory access time which is longer than the clock cycle. The memory access control circuit includes a read initiation circuit responsive to the memory access control circuit for beginning the memory read enable signal within the memory access time but in advance of the clock cycle that defines memory access, and a write initiation circuit responsive to the memory access control circuit for beginning the memory write enable signal after the read enable signal and within the memory access time.

This invention further features a de-coupled read and write memory access method, the method including the steps of providing first and second time reference signals, generating a read enable signal to access a memory array in response to the first time reference and a read signal, and generating a write enable signal independent of the read enable signal in response to the second time reference and a write signal to provide independent, de-coupled write access to the memory array.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
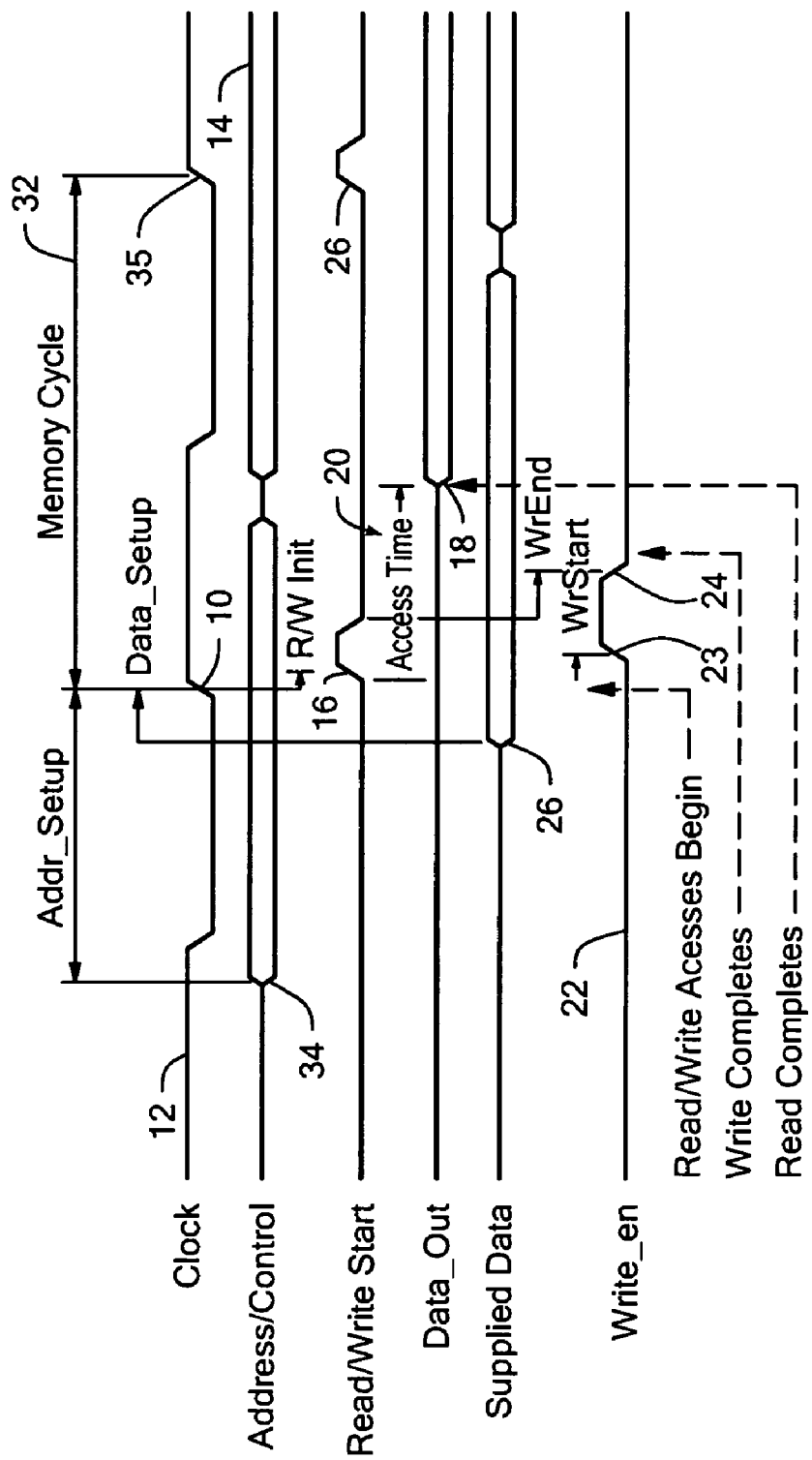
FIG. 1 is a timing diagram of a prior memory access system.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

As discussed in the Background section, prior art memory access systems rely on starting the read and write operations at relatively the same time by utilizing the same transition of a single system clock. For example, FIG. 1 shows a timing diagram of a typical prior art memory access system in which first rising edge 10 of system clock signal 12 enables the initiation of both the read and write signals, indicated at 16, after valid address values and control information, indicated at 34, are available. The read access time, indicated by arrow 20, is the amount of time from the initiation of the read signal, indicated at 16, to when the data values pointed to by the read address have been completely propagated out of memory, indicated at 18. The write operation begins after the write signal, also indicated at 16, is generated and write enable signal 22 is generated (after valid supplied data, indicated at 26, is available), as indicated by rising edge 23, and is completed by falling edge 24 of write enable signal 22. Moreover, although valid address and control information is available, indicated at 34, this information is not used until more than a half cycle later, e.g., rising edge 10 of system clock signal 12.

The memory cycle of this prior art memory access system is limited to the cycle period, indicated by arrow 32, of a single period of system clock signal 12. Hence, both the read and write operations must complete before the next rising edge 35 of system clock signal 12. Coupling the relative start time of the read operation and the write operation to a single transition of a single system clock signal 12 limits the maximum length of the memory cycle and prevents the beginning of the read operation before the write operation.

Figure 2:
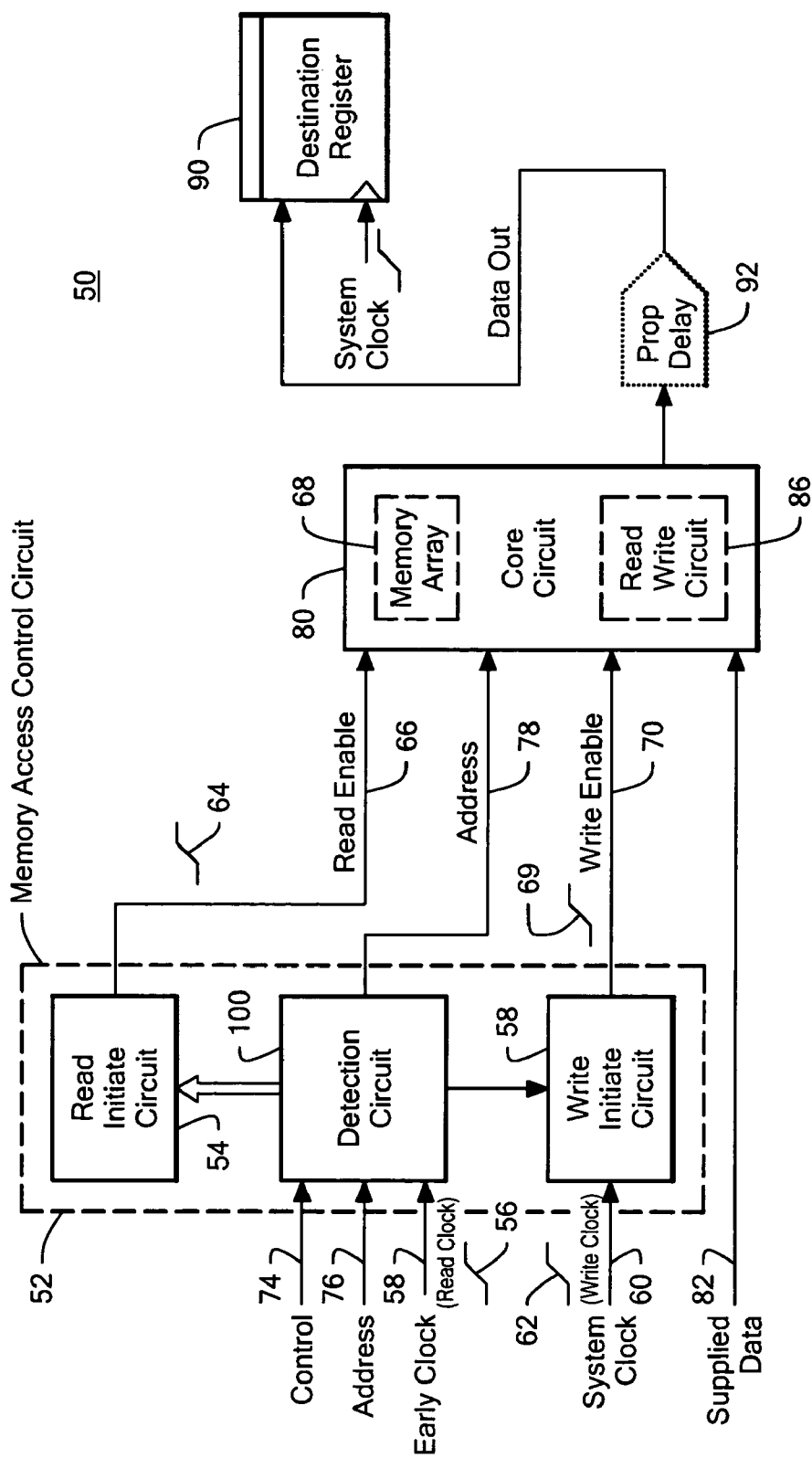
FIG. 2 is a schematic block diagram showing the primary components of one embodiment of the de-coupled memory access system of this invention.

In contrast, de-coupled memory access system 50, FIG. 2 of this invention includes memory access control circuit 52 configured to receive first and second independent de-coupled time references, such as early clock signal 56 on line 58 and system clock signal 62 on line 60. In this design, read initiate circuit 54 is responsive to the first time reference, e.g., early clock signal 56, and a read signal derived from control signals on line 74 and is configured to generate read enable signal 64 on line 66. Write initiate circuit 58 is responsive to system clock signal 62 on line 60 and a write signal also derived from control signals on line 74 and is configured to generate write enable signal 69 on line 70 to provide independent, de-coupled write access to memory array 68.

By utilizing separate independent time references for the write operation and read operations, e.g., early clock signal 56 and system clock signal 60, the write and read operations are completely independent and de-coupled from each other hence providing the ability to start the read operation well before the write operation which results in an increase in the time allowed for a read access. Increasing the time allowed for a read access provides system 50 with the ability to utilize more dense memory, slower memory, or equivalently, eliminating the need to partition the memory into smaller blocks.

Memory access control circuit 52 receives control signals on line 74 which include a read signal that is used to enable read initiate circuit 54 to generate read enable signal 64 in response to early clock signal 56 and a write signal which is used to enable write initiate circuit 58 to generate write enable signal 69 in response to system clock signal 62. Memory access control circuit 52 also receives valid address values on line 76 which specify the exact addresses to be read from memory array 68 and the exact address to be written to memory array 68.

Figure 3:
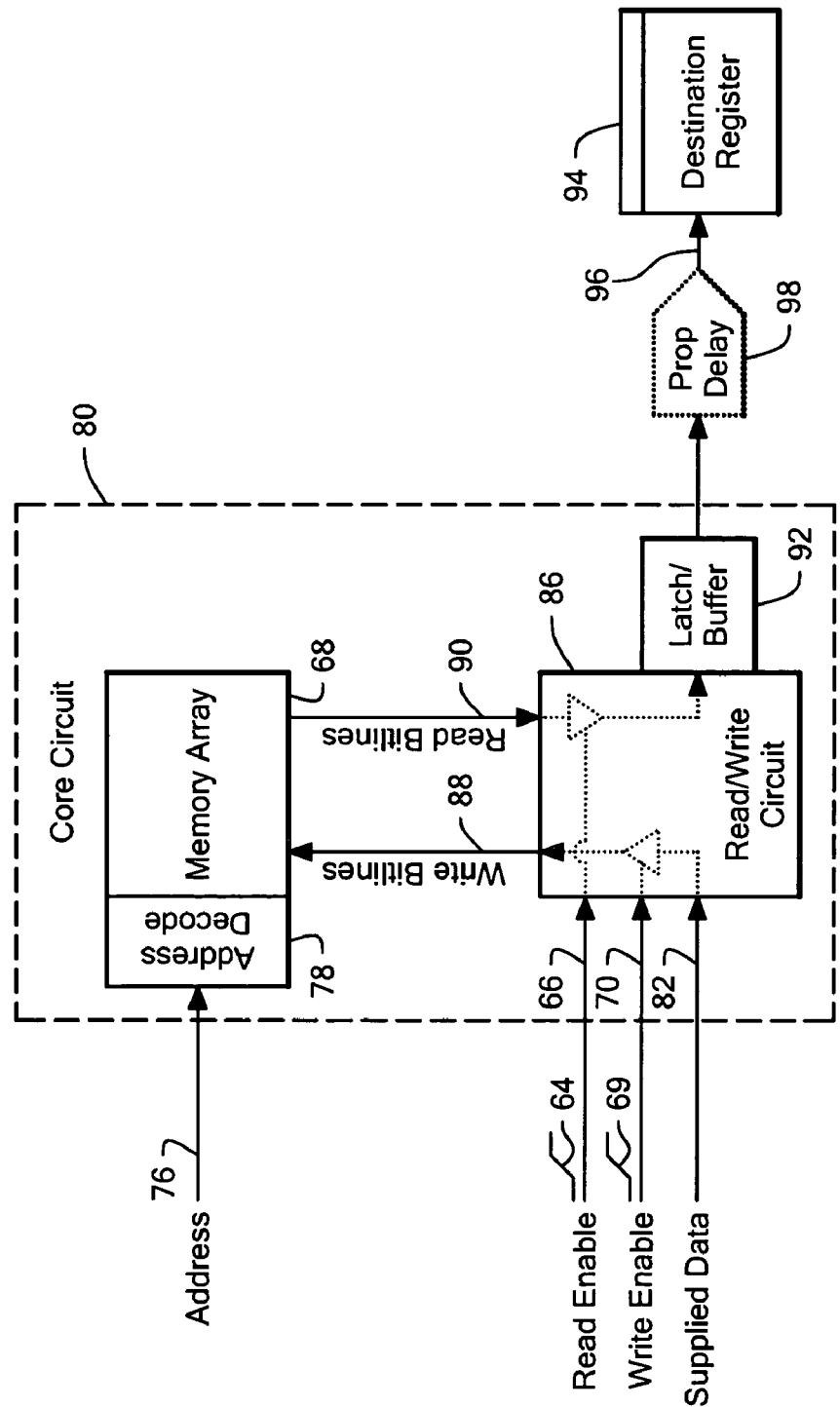
FIG. 3 is a more detailed schematic block diagram of the core circuit shown in FIG. 2.

Core circuit 80 is responsive to read enable signal 64 on line 66, write enable signal 69 on line 70, and valid address values on line 78 and is configured to independently write supplied data on line 82 to memory array 68 in response to write enable signal 69 and independently read stored data from memory array 68 in response to read enable signal 64. Core circuit 80 includes read/write circuit 86, shown in greater detail in FIG. 3, configured to independently write supplied data on line 82 to memory array 68 on line 88 and independently read stored data from memory array 68 on line 90. In one design, read/write circuit 86 may include latch buffer 92 configured to capture read data from memory array 68 on line 90. Latch/buffer 92 holds and forwards the data to destination register 94 on line 96 after the propagation delay time, indicated at 98, associated with time-of-flight wire delay and setting the value in destination register 90. Core circuit 80 also includes address decoder circuit 98 which decodes the valid address values on line 76 and indexes into the proper location in memory array 68.

Figure 4:
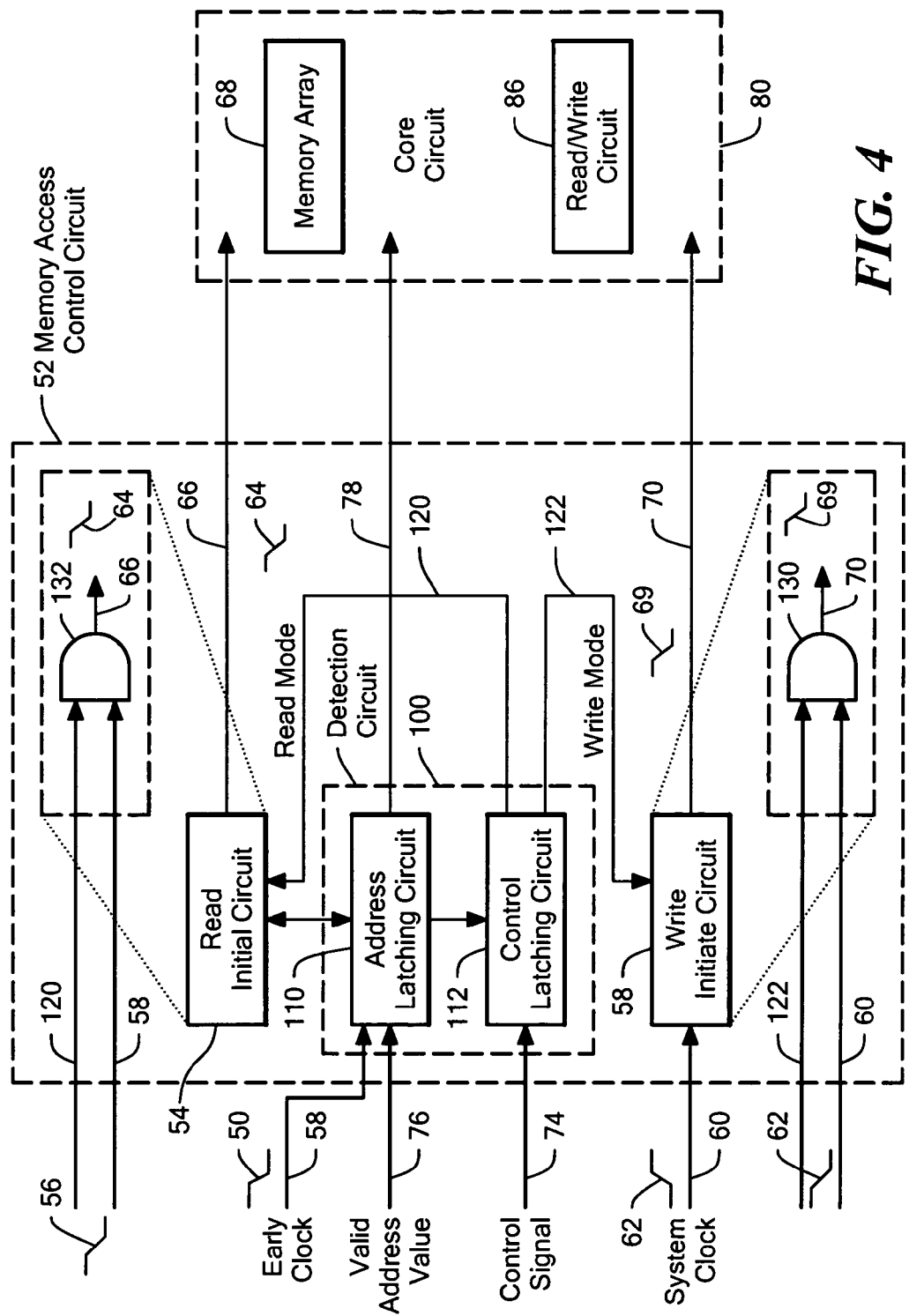
FIG. 4 is a more detailed schematic block diagram of the memory access control circuit shown in FIG. 2.

Memory access control circuit 52, FIG. 4, where like parts have been given like numbers, includes detection circuit 100 responsive to control signals on line 74, valid address values on line 76 and early clock signal 56 on line 58. Detection circuit 100 includes address latching circuit 110 configured to detect and capture valid address values on line 76 and output the captured valid address values on line 78 to decoder 98, discussed above. Control latching circuit 112 detects and captures control signals on line 74 and passes a read signal on line 120 to read initiate circuit 54 and a write signal on line 122 to write initiate circuit 58. Write initiate circuit 58 typically includes gating logic 130 (e.g., an AND gate) configured to pass write enable signal 69 on line 70 (generated by write initiate circuit 58) to core circuit 80 when both a write signal on line 122 and system clock signal 62 on line 60 are present. Similarly, read initiate circuit 54 includes gating logic 132 (e.g., an AND gate) configured to pass read enable signal 64 on line 66 (generated by read initiate circuit 54) to core circuit 80 when both a read signal on line 120 and early clock signal 56 on line 58 are present.

Figure 5:
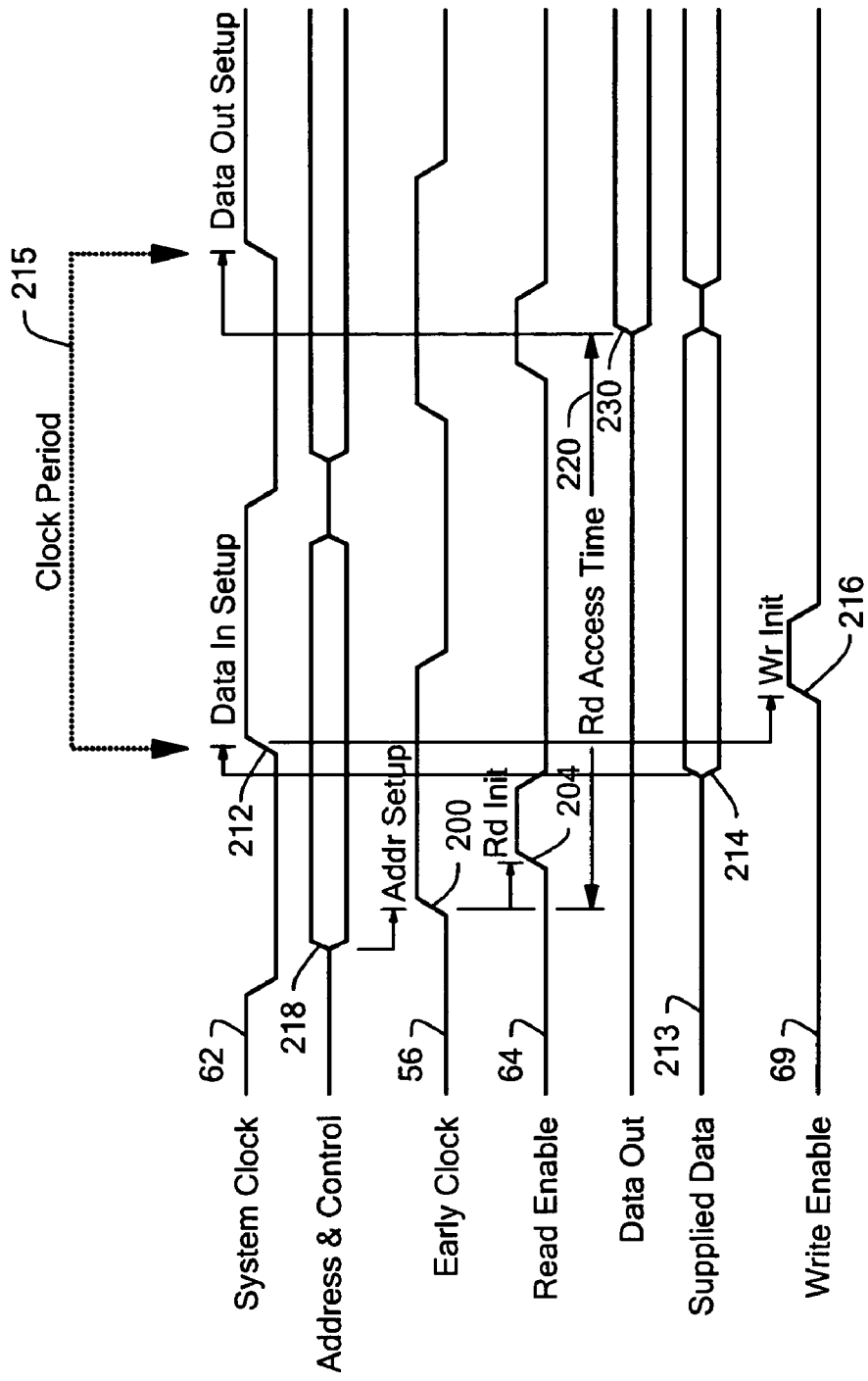
FIG. 5 is a timing diagram of the de-coupled memory access system shown in FIG. 2.

FIG. 5 shows an example timing diagram for the operation of de-coupled memory access system 50, FIG. 2. In this example, a transition of early clock signal 56, FIG. 5, such as first rising edge 200, enables read initiate circuit 54 to generate read enable signal 64, indicated by rising edge 204. A transition of system clock signal 62, such as first rising edge 212, enables write initiate circuit 58 to generate write enable signal 69, indicated by rising edge 216. First rising edge 212 of system clock signal 62 is timed such that it begins after supplied data 213 is valid, indicated at 214. First rising edge 200 of early clock 56 is also timed such that it begins as soon as valid address and control information is available, as indicated at 218.

Because separate independent first and second time references, e.g., early clock signal 56 and system clock signal 62, are used to initiate the generation of read enable signal 64 and write enable signal 69 (in conjunction with the read and write signals), the read operation is de-coupled and independent from the write operation which allows the read and write operations to begin independently. The result is an increase in the read access time, as shown by arrow 220. The read operation begins at rising edge 200 of early clock 56 and completes when the read data is completely propagated out of memory, indicated at 230. As shown by arrow 220, the increased read access time extends beyond the system clock period, indicated at 215, to first rising edge 200 early clock signal 56, thus providing an expanded memory access time (indicated by arrow 220) which is longer than system clock period. The increased read access time provides the ability to use more dense memory, slower memory, and eliminates the need to partition the memory into smaller blocks. Moreover, the initiation of read enable signal 64, indicated by rising edge 204, begins shortly after the address and control information is available, indicated at 218, instead of waiting more than half cycle later, as found in the prior art memory access system described above. Longer access time is provided with system 50 because early read initialization allows the propagation delay to be hidden.

Although in the design above, early clock signal 56 is used to generate the first independent time reference to enable read initiate 54 circuit to generate read enable signal 64 and system clock signal 62 is used to generate the second independent time reference to enable write initiate circuit 58 to generate write enable signal 69, this is not a necessary limitation of this invention, as any transition of early clock signal 56, system clock signal 62, or any combination thereof may be used to generate the first and second independent time references.

Figure 6:
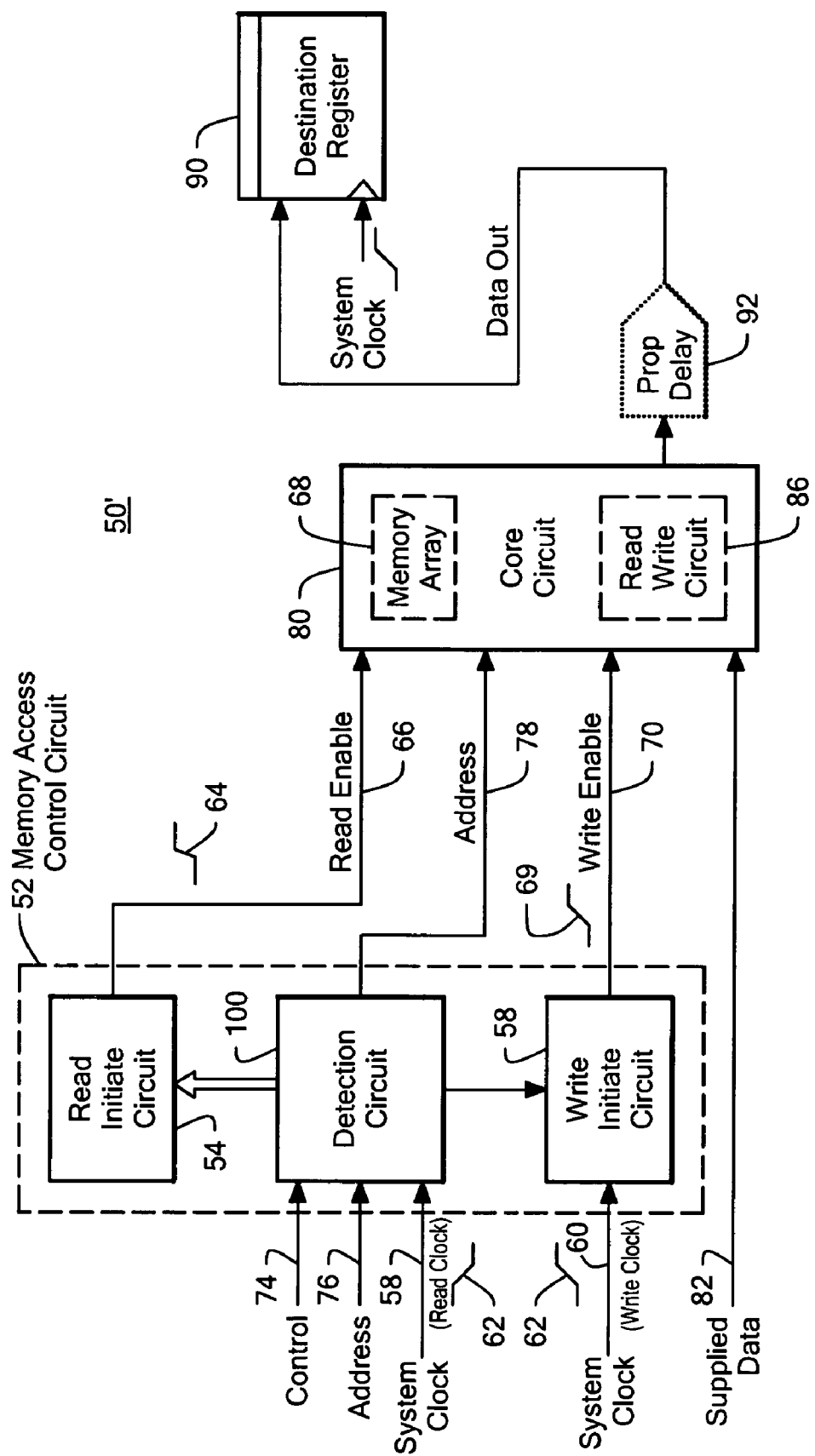
FIG. 6 is a schematic block diagram of another embodiment of the de-coupled memory access system of this invention.

For example, de-coupled memory access system 50', FIG. 6, where like parts have been given like numbers, utilizes different transitions of system clock signal 62 to generate the first and second independent, de-coupled time references to provide independent, de-coupled read and write access to memory array 68. In this example, one transition of system clock signal 62 on line 58 is used to enable read initiate circuit 54 to generate read enable signal 64 and another transition of system clock signal 62 on line 60 is used to enable write initiation circuit 58 to generate write enable signal 69.

Figure 7:
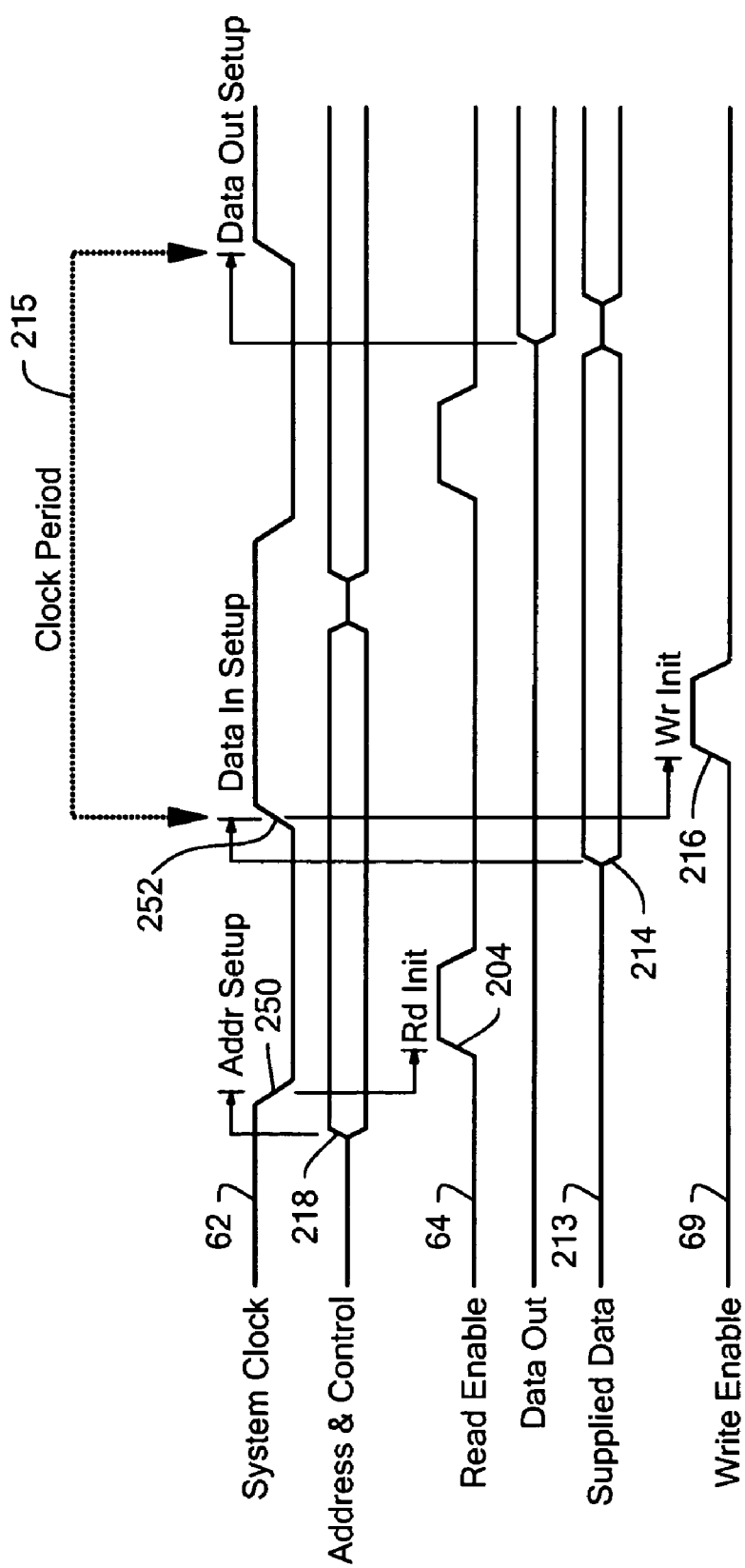
FIG. 7 is a timing diagram of the de-coupled memory access system shown in FIG. 6.

FIG. 7 shows a timing diagram for the operation of de-coupled memory access system 50', FIG. 6. In this example, a transition of system clock signal 62, FIG. 7, such as first falling edge 250 is used to enable read initiate circuit 54 to generate read enable signal 64, indicated by rising edge 204. A different transition of system clock signal 62, such as first rising edge 252 is used to enable write initiate circuit 58 to generate write enable signal 69, indicated at 216. Ideally, first falling edge 250 of system clock signal 62 is delayed such that valid address values and control information, indicated at 218, are available before the initiation of read and write operations. First rising edge 252 of system clock signal 62 is also timed such that it begins after supplied data 213 is valid, indicated at 214 before enabling write initiate circuit 58 to generate write enable signal 69, indicated at 216.

Figure 8:
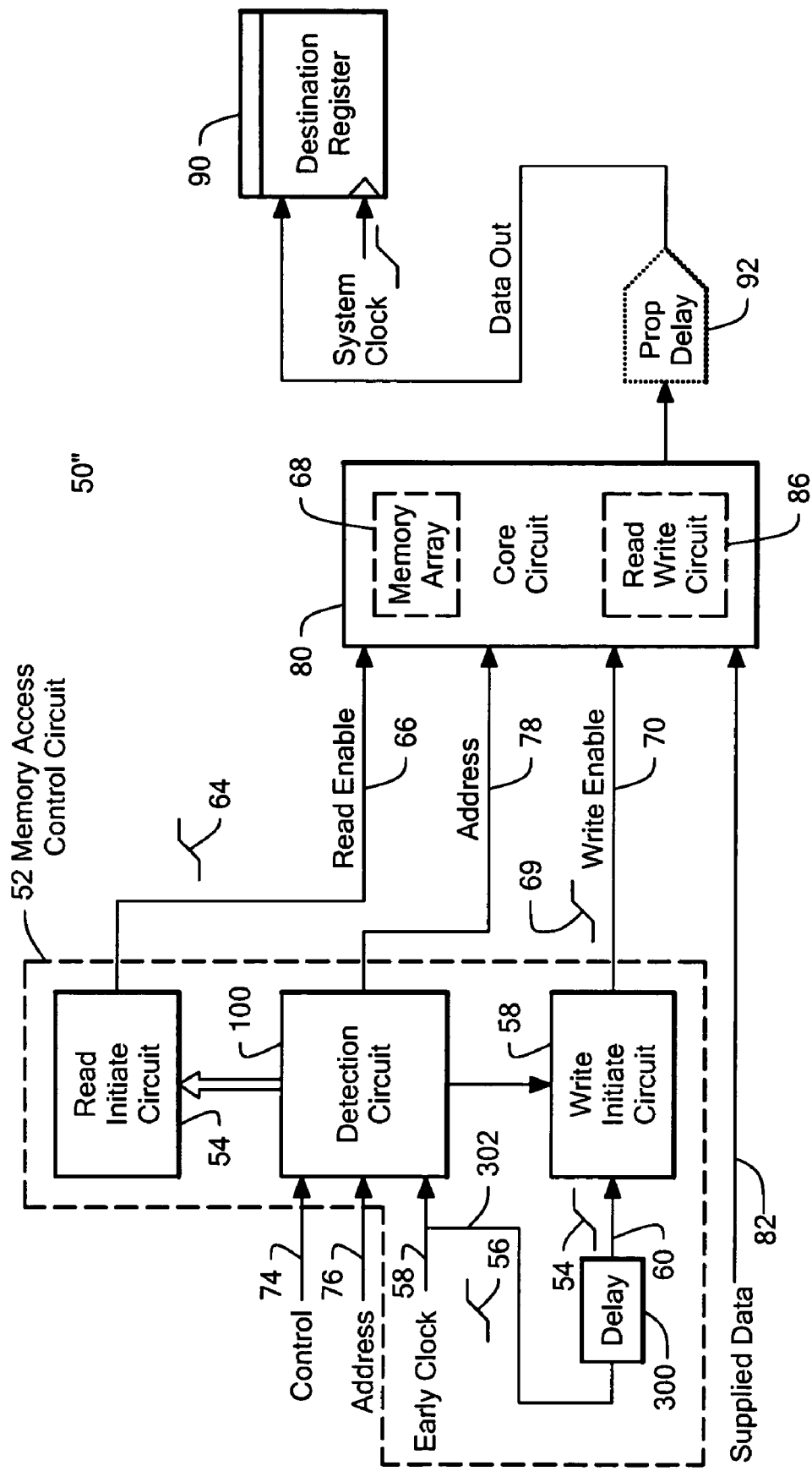
FIG. 8 is a schematic block diagram of another example of the de-coupled memory access system of this invention.

De-coupled memory access system 50'', FIG. 8, where like parts have been given like numbers, utilizes a transition of early clock signal 56 on line 58 to enable read initiate circuit 54 to generate read enable signal 64 on line 66 when control information on line 74 includes a read signal. System 50'' also includes write delay circuit 300 responsive to early clock signal 56 on line 302 which is configured to delay early clock signal 56 on line 60 by a predetermined amount of time, e.g., 2 ns, and provide delayed early clock signal 57 on line 60 to delay write initiate circuit 58 from generating write enable signal 69 on line 70 by that predetermined amount of time. In this design, the independent, de-coupled read operation relies on a transition of the early clock signal 56 while the independent write operation relies on a delayed transition of an early clock signal 57, described in further detail below.

Figure 9:
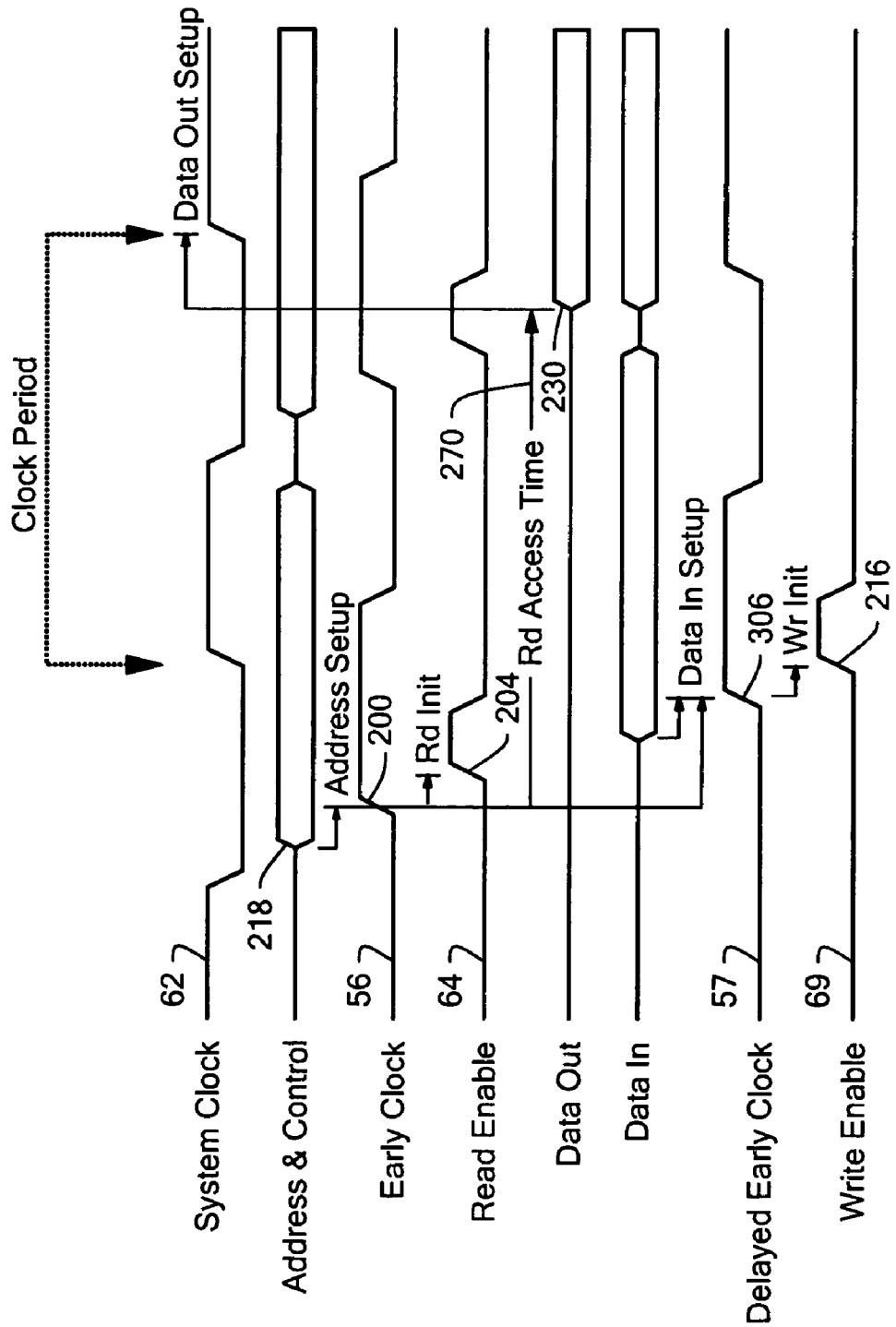
FIG. 9 is a timing diagram of the de-coupled memory access system shown in FIG. 8.

A timing diagram for operation of de-coupled memory access system 50'', FIG. 8, is shown in FIG. 9, where like parts have been given like numbers. In this example, a transition of early clock signal 56, such as first rising edge 200 is used to enable read initiate circuit 54 to generate read enable signal 64 as indicated by rising edge 204. A transition of delayed early clock signal 57, such as first rising edge 306, enables write initiate circuit 58 to generate write enable signal 69, indicated at 216. In this example, the first and second independent de-coupled time references are generated from early signal 56 and a delayed early clock signal.

Figure 10:
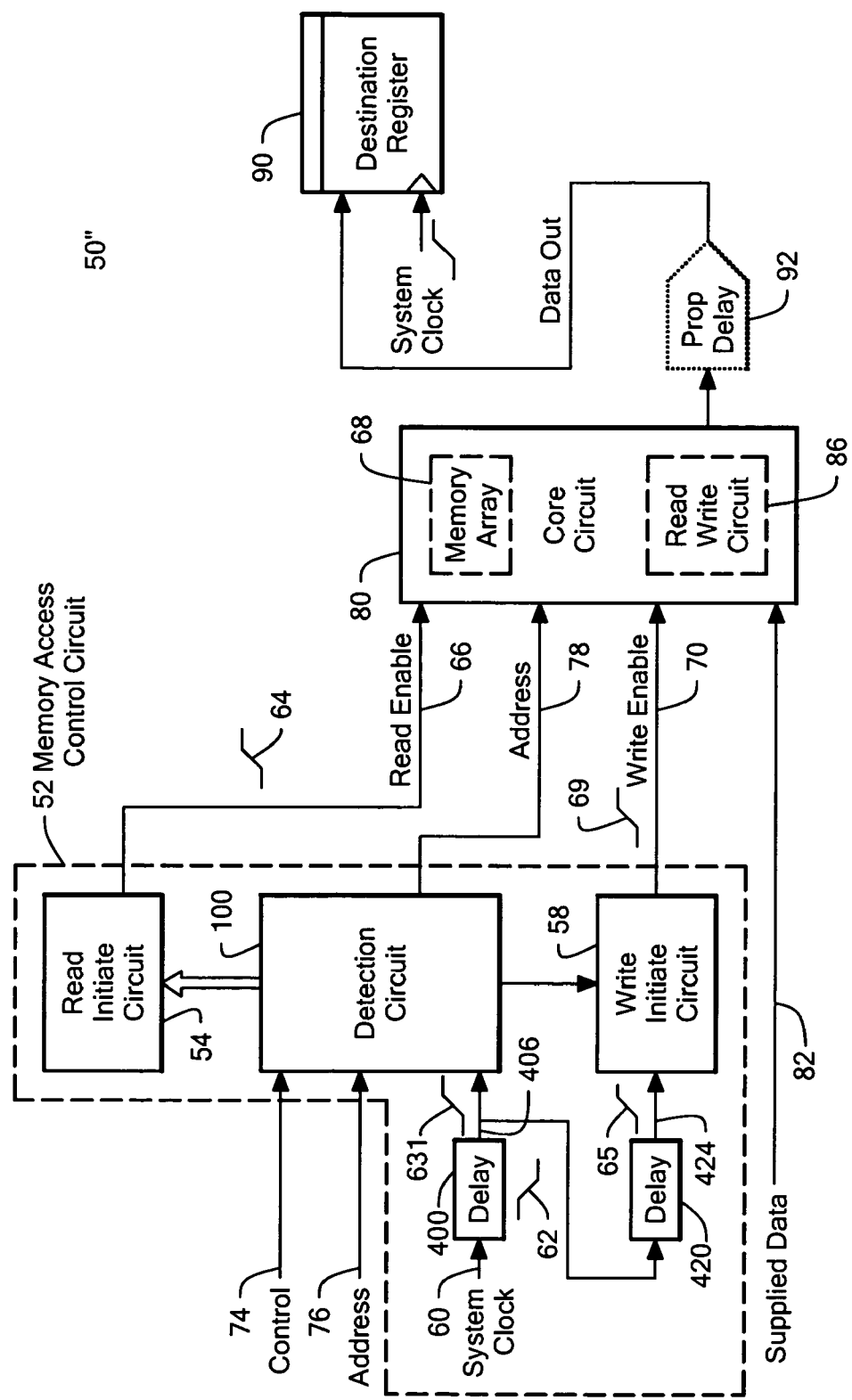
FIG. 10 is a schematic block diagram of yet another example of the de-coupled memory access system of this invention.

De-coupled memory access system 50''', FIG. 10, where like parts have been given like numbers, includes read delay circuit 400 responsive to system clock signal 62 on line 60 which is configured to delay system clock signal 60 by a predetermined amount of time, e.g., 0.5 ns, and output delayed system clock signal 63 on line 406 to delay generation of read enable signal 64 by read initiate circuit 54 by the predetermined amount of time. Write delay circuit 420 is responsive to system clock signal 62 on line 406 and is configured to delay system clock signal 62 by a predetermined amount of time, e.g., 2.5 ns and output delayed system clock signal 65 on line 424 to delay generation of write enable signal 69 on line 70 by write initiate circuit 58 by the predetermined amount of time. In this example, the read and write operations are effectively de-coupled and independent of each other by utilizing transitions of two separate delayed system clock signals 62.

Figure 11:
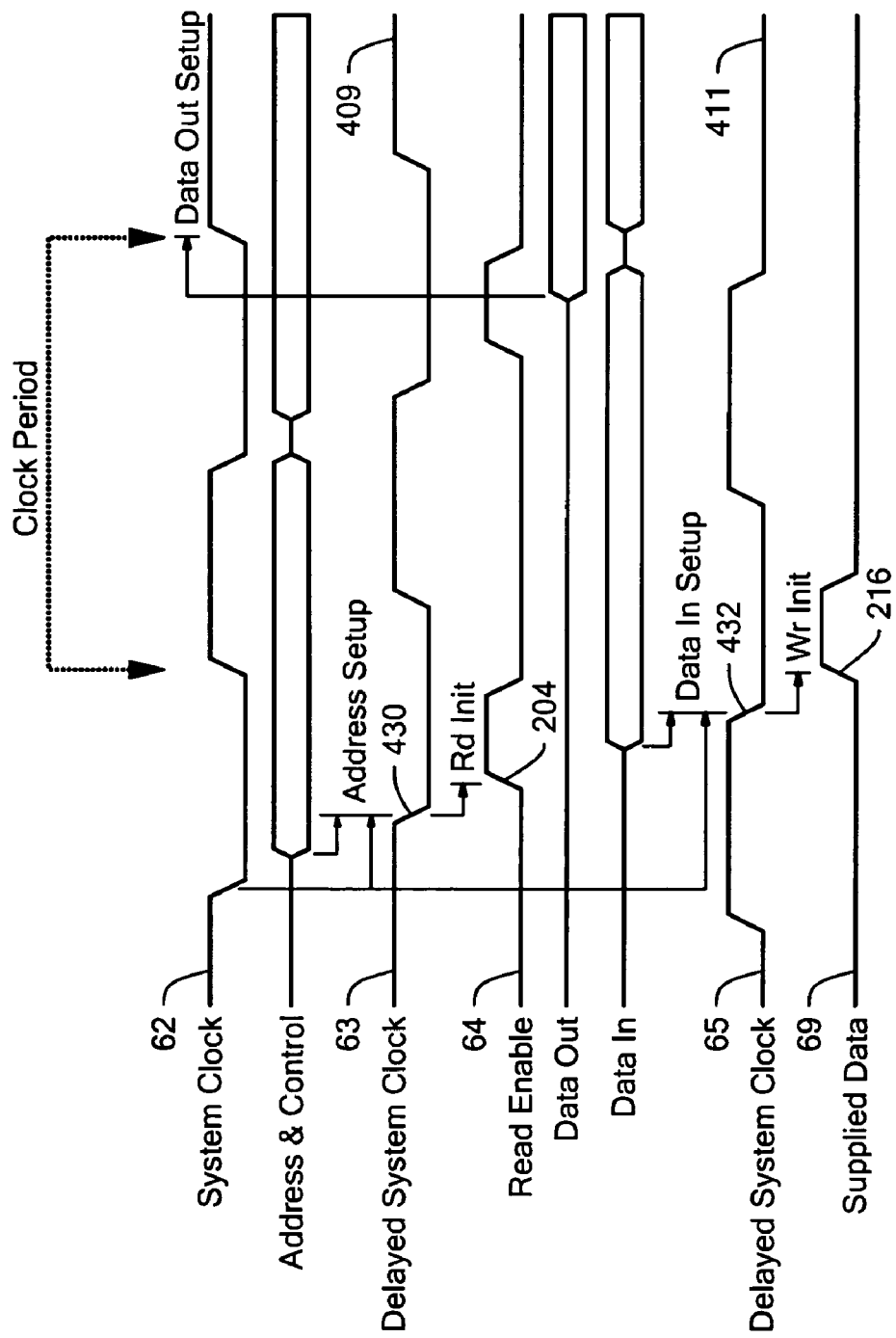
FIG. 11 is a timing diagram of the de-coupled memory access system shown in FIG. 10.

A timing diagram of the operation of de-coupled memory access system 50''', FIG. 10, is shown in FIG. 11, where like parts have been given like numbers. In this example, a transition of delayed system clock signal 63, FIG. 11, indicated at 409, such as first falling edge 430, is used to enable read initiate circuit 54 to generate read enable signal 64, indicated by rising edge 204. A transition of the second delayed system clock signal 65, indicated at 411, such as first falling edge 432 is used to enable write initiate circuit 58 to generate write enable signal 69, indicated at 216.

Although as shown in FIGS. 5, 7, 9, and 11, various transitions of system clock signal 62, early clock signal 56, delayed system clock signal 62, and delayed early clock signal 56 are used to generate the first and second time references which enable read initiate circuit 54 to generate read enable signal 64 and write initiate circuit 58 to generate write enable signal 69, this is not a necessary limitation of this invention, as any combination of transitions of system clock signal 62, early clock signal 56, delayed system clock signal 62 and delayed early clock signal 56 may be used to generate the first and second time references to provide independent, de-coupled read and write accesses to memory array 68 to effectively increase the read access time of de-coupled memory access system 50, provided the address, control and data set-up allow it.

Figure 12:
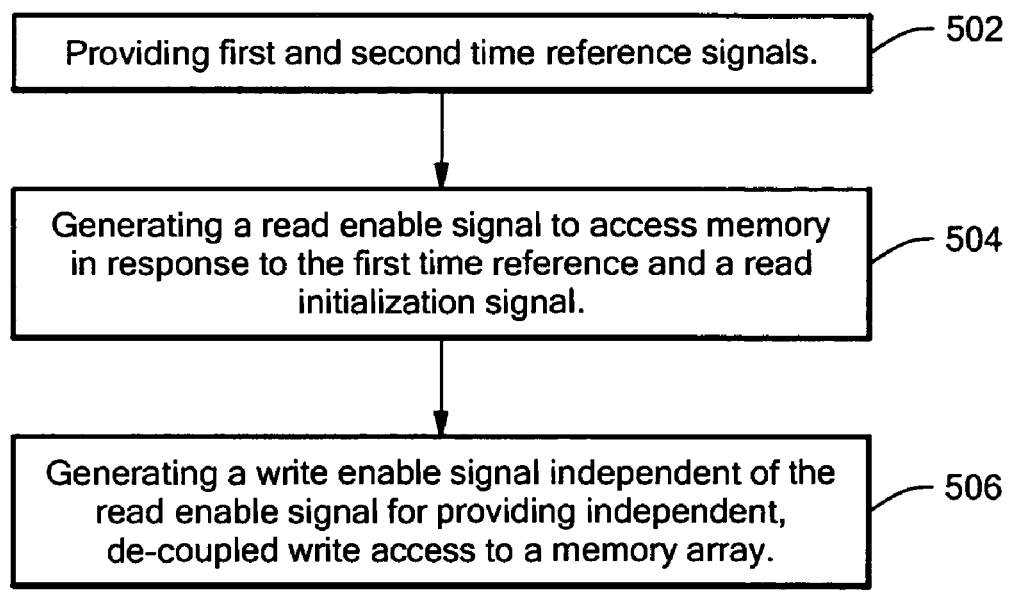
FIG. 12 is a block diagram showing the primary steps of de-coupled read and write access method of this invention.

De-coupled read and write access method 500, FIG. 12, of this invention includes the steps of providing first and second time references, step 502, generating a read enable signal to access memory array in response to the first time reference and a read signal, step 504, and generating a write enable signal independent of the read enable signal in response to the second time reference and a write signal to provide independent, de-coupled write access to the memory array, step 506.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A de-coupled memory access system comprising:
a memory access control circuit configured to generate first and second independent, de-coupled time references, said memory access control circuit including:
a read initiate circuit responsive to said first time reference and a read signal for generating a read enable signal, and
a write initiate circuit responsive to said second time reference and a write signal for generating a write enable signal independent of said read enable signal for providing independent, de-coupled write access to a memory array to independently generate the read enable signal in relation to the write enable signal to increase the time allowed for a read access in each cycle, in which there is a single read enable signal or a single write enable signal in each cycle.

2. The system of claim 1 in which said memory access control circuit is responsive to control signals and valid address values.

3. The system of claim 2 in which said control signals include said read signal and said write signal.

4. The system of claim 2 in which said valid address values specify the locations of data to be read from said memory array and the locations of data to be written to said memory array.

5. The system of claim 4 in which said memory access control circuit further includes a detection circuit responsive to said control signal, said valid address values and said first time reference, said detector circuit configured to detect said read signal and said write signal from said control signals.

6. The system of claim 5 in which said detection circuit includes an address latching circuit configured to detect and capture said valid address values.

7. The system of claim 5 in which said detection circuit includes a control latching circuit configured to detect and capture at least one of said control signals.

8. The system of claim 2 further including a core circuit responsive to said read enable signal, said write enable signal, and said valid address values, said core circuit configured to independently write supplied data to said memory array in response to said write enable signal and independently read stored data from said memory array in response to said read enable signal.

9. The system of claim 8 in which said core circuit further includes a read/write circuit for independently writing said supplied data to said memory array and independently reading said stored data from said memory array.

10. The system of claim 9 in which said read/write circuit further includes a latch buffer configured to store said read data.

11. The system of claim 10 in which said read/write circuit forwards the data stored in said latch buffer to a destination register.

12. The system of claim 8 in which said write initiate circuit includes a gating circuit configured to pass said write enable signal generated by said write initiate circuit to said core circuit when said write signal and said second time reference are received.

13. The system of claim 8 in which said read initiate circuit includes a gating circuit configured to pass said read enable signal generated by said read initiate circuit to said core circuit when said read signal and said first time reference are received.

14. The system of claim 1 in which said first time reference is generated from an early clock signal.

15. The system of claim 14 in which a transition of said early clock signal enables said read initiate circuit to generate said read enable signal.

16. The system of claim 15 in which a first rising edge of said early clock signal enables said read initiate circuit to generate said read enable signal.

17. The system of claim 1 in which said second time reference is generated from a system clock signal.

18. The system of claim 17 in which a transition of said system clock signal enables said write initiate circuit to generate said write enable signal.

19. The system of claim 18 in which a first rising edge of said system clock enables said write initiate circuit to generate said write enable signal.

20. The system of claim 1 in which said first time reference and said second time references are generated from a system clock signal.

21. The system of claim 1 in which a first transition of a system clock signal enables said read initiate circuit to generate said read enable signal.

22. The system of claim 21 in which a first falling edge of said system clock enables said read initiate circuit to generate said read enable signal.

23. The system of claim 21 in which a second transition of said system clock signal enables said read initiate circuit to generate said read enable signal.

24. The system of claim 23 in which a first rising edge of said system clock enables said read initiate circuit to generate said read enable signal.

25. The system of claim 1 in which said first time reference is generated by a read delay circuit responsive to a system clock signal, said read delay circuit being configured to delay said system clock signal by an amount of time to delay said read initiate circuit from generating said read enable signal by an amount of time.

26. The system of claim 25 in which said second time reference is generated by a write delay circuit connected to a system clock, said write delay being configured to delay said system clock signal by a time to delay said write enable circuit from generating said write enable signal by said time.

27. A de-coupled read and write memory access method, the method comprising the steps of:
providing first and second time reference signals from a memory access control circuit;
generating a read enable signal from the memory access control circuit to access a memory array in response to said first time reference and a read initialization signal; and
generating a write enable signal from a memory access control circuit, independent of said read enable signal in response to said second time reference and a write signal to provide independent, de-coupled write access to said memory array to independently generate the read enable signal in relation to the write enable signal to increase the time allowed for a read access in each cycle, in which there is a single read enable signal or a single write enable signal in each cycle.

* * * * *